(12) United States Patent
Wang

(10) Patent No.: US 11,374,084 B2
(45) Date of Patent: Jun. 28, 2022

(54) ORGANIC LIGHT EMITTING DISPLAY PANEL AND DISPLAY DEVICE

(71) Applicants: WUHAN TIANMA MICROELECTRONICS CO., LTD., Wuhan (CN); WUHAN TIANMA MICROELECTRONICS CO., LTD. SHANGHAI BRANCH, Shanghai (CN)

(72) Inventor: Yaolin Wang, Shanghai (CN)

(73) Assignees: WUHAN TIANMA MICROELECTRONICS CO., LTD., Wuhan (CN); WUHAN TIANMA MICROELECTRONICS CO., LTD. SHANGHAI BRANCH, Shanghai (CN)

( * ) Notice: Subject to any disclaimer, the term of this patent is extended or adjusted under 35 U.S.C. 154(b) by 0 days.

(21) Appl. No.: 16/674,328

(22) Filed: Nov. 5, 2019

(65) Prior Publication Data

US 2020/0357875 A1    Nov. 12, 2020

(30) Foreign Application Priority Data

May 7, 2019   (CN) .......................... 201910375170.0

(51) Int. Cl.
  *H01L 27/32*   (2006.01)
  *G09G 3/3258*  (2016.01)
  *H01L 51/52*   (2006.01)

(52) U.S. Cl.
  CPC ....... *H01L 27/3276* (2013.01); *G09G 3/3258* (2013.01); *H01L 27/326* (2013.01); *H01L 51/5206* (2013.01); *G09G 2320/0233* (2013.01)

(58) Field of Classification Search
  CPC .............. H01L 27/3276; H01L 27/326; H01L 51/5206; G09G 3/3258
  See application file for complete search history.

(56) References Cited

U.S. PATENT DOCUMENTS 8,446,345 B2 *  5/2013  Yu ........................ G09G 3/3233
                                              345/76
9,129,923 B1 *  9/2015  Han .................... H01L 27/3262
                  (Continued)

FOREIGN PATENT DOCUMENTS

CN        104809988 A      7/2015
CN        107403827 A     11/2017

*Primary Examiner* — Nelson M Rosario
*Assistant Examiner* — Scott Au
(74) *Attorney, Agent, or Firm* — Christensen O'Connor Johnson Kindness PLLC

(57) ABSTRACT

An organic light emitting display panel and a display device are provided. The organic light emitting display panel includes: an anode power wire, the anode power wire including a first extension segment and a second extension segment, a head end of the first extension segment being electrically connected to the driving power supply, a tail end of the first extension segment being electrically connected to a head end of the second extension segment; each sub-pixel includes a light emitting device and two pixel driving circuits, anode connection terminals of the two pixel driving circuits are electrically connected to an anode of the light emitting device; anode power wire connection terminals of the two pixel driving circuits are electrically connected to the first extension segment and the second extension segment, respectively.

19 Claims, 11 Drawing Sheets

(56) References Cited

U.S. PATENT DOCUMENTS

| | | | | |
|---|---|---|---|---|
| 2008/0180364 A1* | 7/2008 | Kim | ................... | G09G 3/3233 |
| | | | | 345/76 |
| 2017/0124952 A1 | 5/2017 | Zhang et al. | | |
| 2019/0035813 A1 | 1/2019 | Huang et al. | | |
| 2019/0326381 A1* | 10/2019 | Hou | ................... | G09G 3/3233 |
| 2019/0341431 A1* | 11/2019 | Lee | ................... | G09G 3/3258 |

* cited by examiner

ORGANIC LIGHT EMITTING DISPLAY PANEL AND DISPLAY DEVICE

CROSS-REFERENCE TO RELATED APPLICATIONS

The present application claims priority to Chinese Patent Application No. 201910375170.0, filed on May 7, 2019, the content of which is incorporated herein by reference in its entirety.

TECHNICAL FIELD

The present disclosure relates to the field of display technologies, and more particularly, to an organic light emitting display panel and a display device.

BACKGROUND

With the development of display technologies, an Organic Light Emitting Display (OLED) panel has more and more applications due to its excellent characteristics such as self-luminous, high brightness, wide viewing angle and fast response. The organic light emitting display panel includes a light emitting device, a pixel driving circuit corresponding to each light emitting device, and an anode signal wire. The pixel driving circuit is used to drive the light emitting device to emit light to realize display of sub-pixels. The anode signal wire extends from one end of the organic light emitting display panel to the other opposite end, for transferring an anode power supply voltage to each pixel driving circuit in a display region.

However, as resolution continues to increase, available space in the display region becomes smaller and smaller, and a signal wire width becomes smaller and smaller, such that a voltage drop greatly changes during transmission of the anode power supply voltage on the anode signal wire. A difference in anode power supply voltage values acquired by respective pixel driving circuits is relatively large, thereby causing a problem of uneven display brightness.

SUMMARY

Embodiments of the present disclosure provide an organic light emitting display panel and a display device, which can alleviate a problem of uneven display brightness caused by a voltage drop of an anode power supply voltage on a signal wire.

In one aspect, an embodiment of the present disclosure provides an organic light emitting display panel, the organic light emitting display panel having a display region and a first non-display region located at a side of the display region in a column direction, the organic light emitting display panel including:

a plurality of pixel driving circuits arranged in a matrix and located in the display region;

a driving power supply located in the first non-display region;

one or more anode power wires each comprising a first extension segment and a second extension segment, a head end of the first extension segment being electrically connected to the driving power supply, the first extension segment extending at least to a first position along the column direction, a tail end of the first extension segment being electrically connected to a head end of the second extension segment, the second extension segment extending at least to a second position along the column direction, wherein a row of pixel driving circuits of the plurality of pixel driving circuits in the display region that is farthest from the first non-display region is located at the first position, and a row of pixel driving circuits of the plurality of pixel driving circuits in the display region that is closest to the first non-display region is located at the second position; and one or more first sub-pixel columns corresponding to the one or more anode power wire, each of the one or more first sub-pixel columns comprising a plurality of sub-pixels arranged in the column direction, each of the plurality of sub-pixels comprising a light emitting device and two pixel driving circuits of the plurality of pixel driving circuits, the light emitting device comprising a cathode, an organic light emitting layer and an anode that are disposed in a stacked manner, each of the two pixel driving circuits comprising an anode power wire connection terminal, an anode connection terminal, and a driving transistor connected in series between the anode power wire connection terminal and the anode connection terminal, wherein in the sub-pixel, the anode connection terminals of the two pixel driving circuits are electrically connected to the anode of the light emitting device;

wherein in each of the plurality of sub-pixels of each first sub-pixel column of the one or more first sub-pixel columns, the anode power wire connection terminals of the two pixel driving circuits are respectively electrically connected to the first extension segment and the second extension segment of one of the one or more anode power wires corresponding to the first sub-pixel column.

In another aspect, an embodiment of the present disclosure provides a display device including the organic light emitting display panel above.

In the organic light emitting display panel and the display device in the embodiments of the present disclosure, the same light emitting device is configured to be driven by two pixel driving circuits, and the two pixel driving circuits respectively obtain the anode power supply voltage from the first extension segment and the second extension segment. Transmission directions of the anode power supply voltage on the first extension segment and the second extension segment are opposite to each other, such that in the driving process of the light emitting device, the anode power supply voltage at the corresponding position on the first extension segment and the second extension segment is compensated. Thus, for different sub-pixels in the first sub-pixel column, brightness of the light emitting device are closer, i.e., the problem of uneven display brightness caused by the voltage drop of the anode power supply voltage on the signal wire is alleviated.

BRIEF DESCRIPTION OF DRAWINGS

In order to better illustrate technical solutions of embodiments of the present disclosure, the accompanying drawings used in the embodiments are briefly described below. The drawings described below are merely a part of the embodiments of the present disclosure. Based on these drawings, those skilled in the art can obtain other drawings without any creative effort.

DESCRIPTION OF EMBODIMENTS

In order to better understand technical solutions of the present disclosure, the embodiments of the present disclosure are described in details with reference to the drawings. It should be clear that the described embodiments are merely part of the embodiments of the present disclosure rather than all of the embodiments. All other embodiments obtained by those skilled in the art without paying creative effort shall fall into the protection scope of the present disclosure.

The terms used in the embodiments of the present disclosure are merely for the purpose of describing particular embodiments and not intended to limit the present disclosure. Unless otherwise noted in the context, the singular form expressions "a", "an", "the" and "said" used in the embodiments and appended claims of the present disclosure are also intended to represent a plural form.

Figure 1:
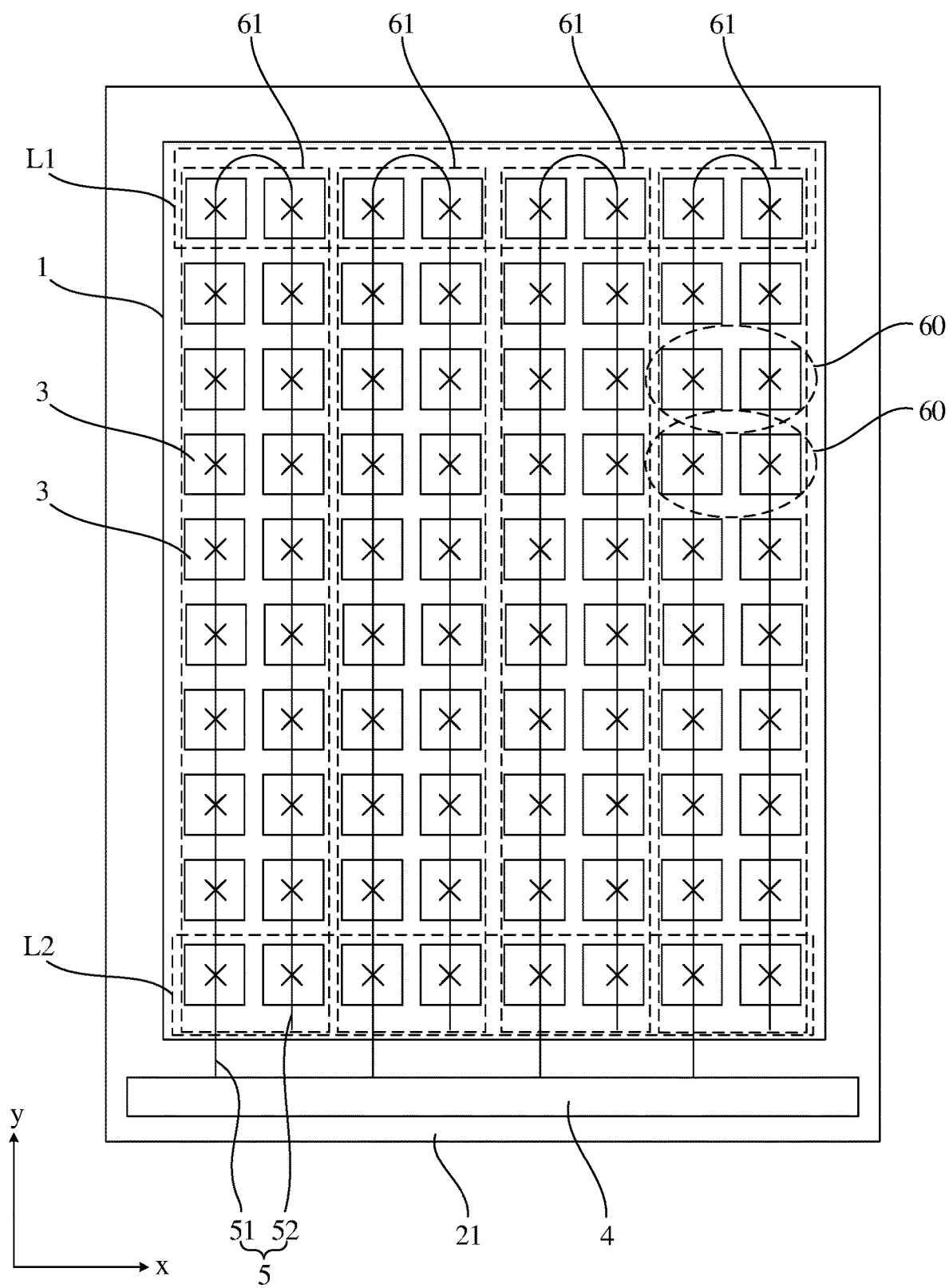
FIG. 1 is a structural schematic diagram of an organic light emitting display panel according to an embodiment of the present disclosure.
Figure 2:
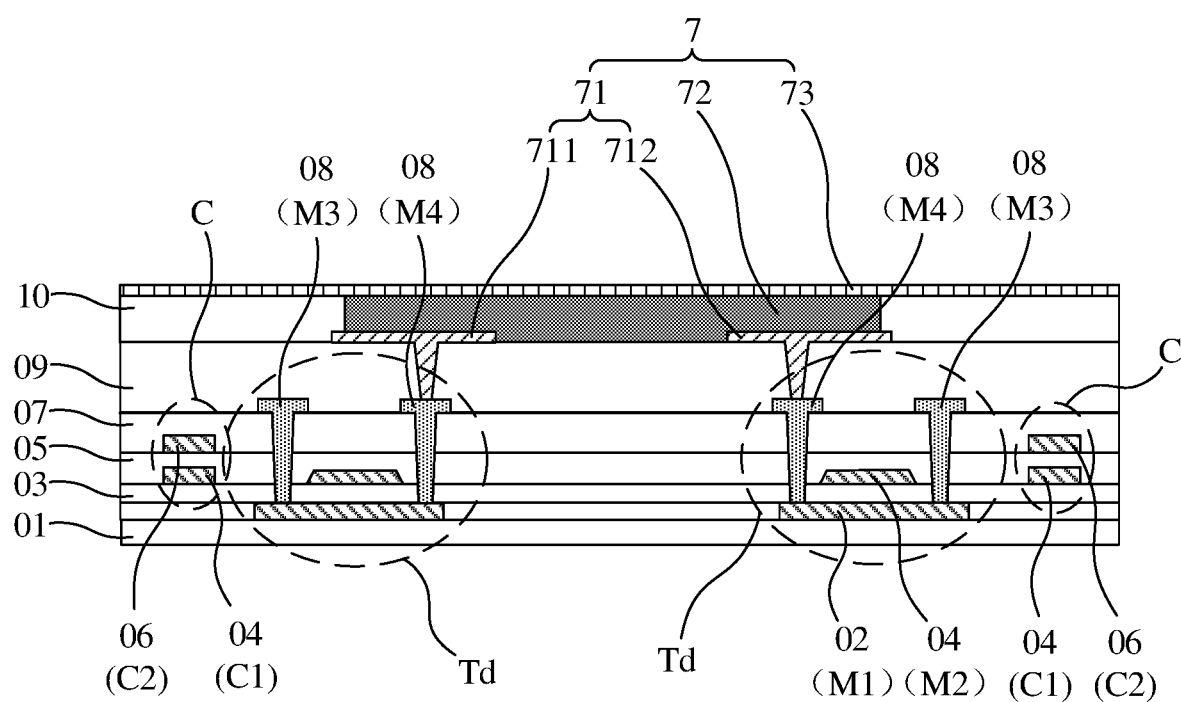
FIG. 2 is a cross-sectional structural schematic diagram of a sub-pixel in FIG. 1.
Figure 3:
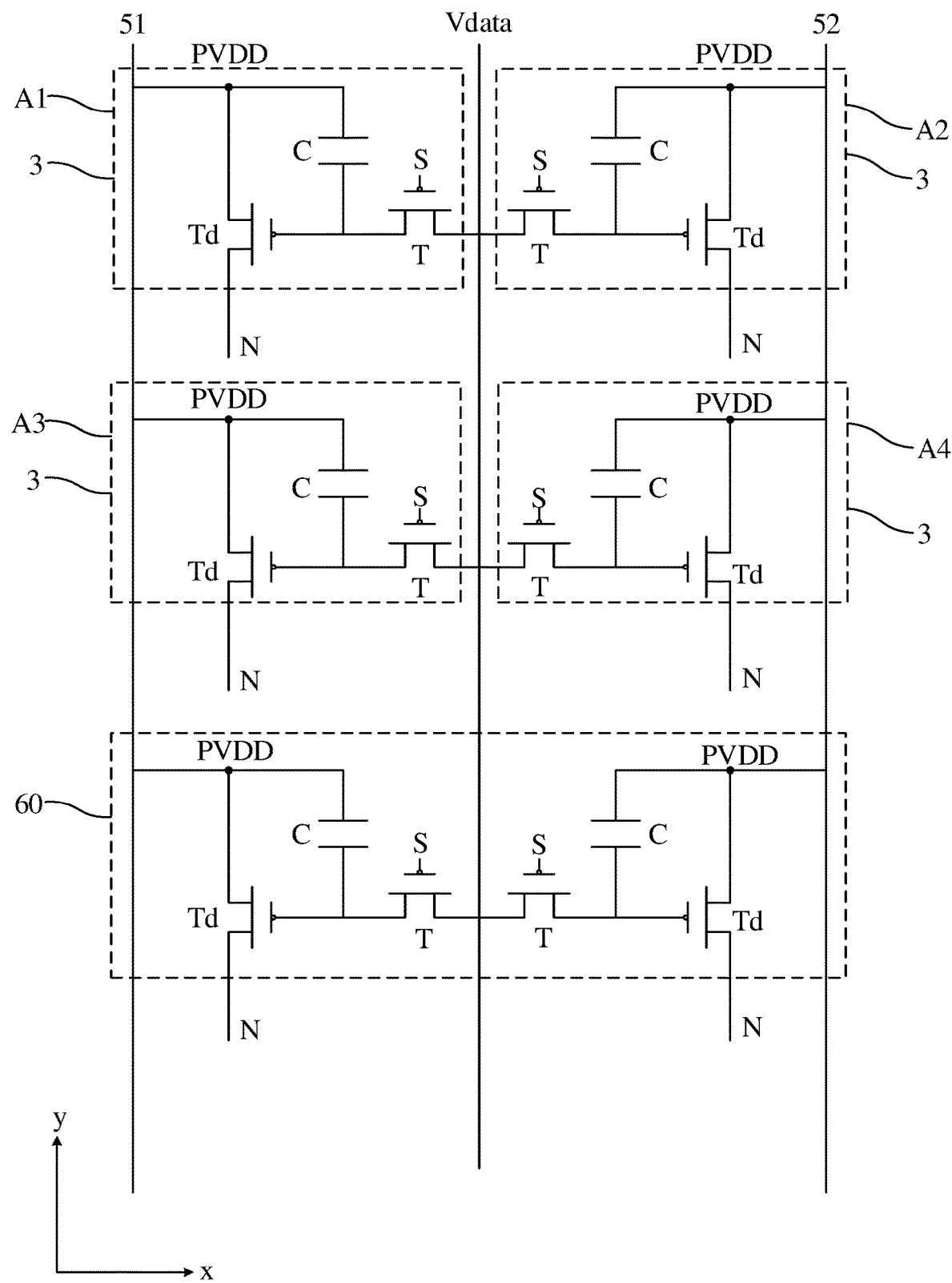
FIG. 3 is an equivalent circuit diagram of a part of pixels in a first sub-pixel column in FIG. 1.

As shown in FIG. 1, FIG. 2 and FIG. 3, FIG. 1 is a structural schematic diagram of an organic light emitting display panel according to an embodiment of the present disclosure. FIG. 2 is a cross-sectional structural schematic diagram of a sub-pixel in FIG. 1, and FIG. 3 is an equivalent circuit diagram of a part of pixels in a first sub-pixel column in FIG. 1. An embodiment of the present disclosure provides an organic light emitting display panel, including: a display region 1, and a first non-display region 21 located at a side of the display region 1 in a column direction y; pixel driving circuits 3 arranged in a matrix and located in the display region 1; a driving power supply 4 located in the first non-display region 21; anode power wires 5, each of the anode power wires 5 including a first extension segment 51 and a second extension segment 52, a head end of the first extension segment 51 being electrically connected to the driving power supply 4, the first extension segment 51 extending at least to a first position L1 along the column direction y, the first position L1 being a position where a row of the pixel driving circuits 3 in the display region 1 that is farthest from the first non-display region 21 is located, i.e., a position where a first row of the pixel driving circuits 3 counting from top to bottom is located shown in FIG. 1, a tail end of the first extension segment 51 is electrically connected to a head end of the second extension segment 52, the second extension segment 52 extending at least to a second position L2 along the column direction y, the second position L2 being a position where a row of the pixel driving circuits 3 in the display region 1 that is closest to the first non-display region 21 is located, i.e., a position where a last row of the pixel driving circuit 3 counting from top to bottom is located in FIG. 1; a first sub-pixel column 61 corresponding to the anode power wire 5. The first sub-pixel column 61 includes a plurality of sub-pixels 60 arranged in the column direction y. Each of the sub-pixels 60 includes a light emitting device 7 (not shown in FIG. 1) and two pixel driving circuits 3. Each of the light emitting devices 7 includes an anode 71, an organic light emitting layer 72, and a cathode 73 which are disposed in a stacked manner. Each of the pixel driving circuits 3 includes an anode power wire connection terminal PVDD, an anode connection terminal N, and a driving transistor Td connected in series between the anode power wire connection terminal PVDD and the anode connection terminal N. In the sub-pixel 60, the anode connection terminals N of the two pixel driving circuits 3 are electrically connected to the anode 71 of the light emitting device 7. In each of the sub-pixels 60 of the first sub-pixel column 61, the anode power wire connection terminals PVDD of two pixel driving circuits 3 are electrically connected to the first extension segment 51 and the second extension segment 52 of the anode power wire 5 corresponding to the first sub-pixel column 61, respectively.

For example, the display panel includes a buffer layer 01, a semiconductor layer 02, a gate insulation layer 03, a gate metal layer 04, a first interlayer insulation layer 05, a capacitance metal layer 06, a second interlayer insulation layer 07, a source/drain metal layer 08, a planarization layer 09 and a pixel defining layer 10, which are sequentially stacked in a direction perpendicular to a plane in which the organic light emitting display panel is located. The pixel driving circuit 3 and the light emitting device 7 are further included, and the pixel driving circuit 3 is used to drive the light emitting device 7. The pixel driving circuit 3 includes a thin film transistor and a storage capacitor C. The thin film transistor includes a driving transistor Td. A film structure of the following thin film transistor is described by taking the driving transistor Td as an example. The driving transistor Td includes an active layer M1, a gate M2, a source M3, and a drain M4. The active layer M1 is located in the semiconductor layer 02, and the gate M2 is located in the gate metal layer 04. The source M3 and the drain M4 are located in the source/drain metal layer 08. The storage capacitor C includes a first electrode plate C1 and a second electrode plate C2. The first electrode plate C1 is located in the gate metal layer 04, and the second electrode plate C2 is located in the capacitance metal layer 06. The pixel defining layer 10 is provided with openings, and each opening corresponds to one light emitting device 7. The light emitting device 7 includes an anode 71, an organic light emitting layer 72 and a cathode 73, and the anodes 71 of the respective light emitting devices 7 are independent from each other. In a direction perpendicular to the organic light emitting display panel, the anode 71 overlaps the opening in the pixel defining layer 10. The organic light emitting layer 72 is located in the opening of the pixel defining layer 10, and a light emission area of the light emitting device 7 is defined by the opening of the pixel defining layer 10. The cathode 73 covers each opening of the pixel defining layer 10. In display region 1, the cathode 73 may be a continuous structure over the entire surface. In the present embodiment, the drain M4 of the driving transistor Td in the pixel driving circuit is electrically connected to the anode 71 of the corresponding light emitting device 7 through a via-hole, for supplying voltage to the anode 71. Under an action of a voltage applied to the anode 71 and the cathode 73, holes and electrons will be injected into the organic light emitting layer 72 and are recombined in the organic light emitting layer 72 so as to release energy to achieve light emission. Taking the pixel driving circuit 3 shown in FIG. 3 as an example, the pixel driving circuit 3 shown in FIG. 3 is a 2T1C structure. i.e., a structure including two thin film transistors and one capacitor. The pixel driving circuit 3 includes one switching transistor T, one driving transistor Td and one storage capacitor C. One terminal of a source and a drain in the driving transistor Td is electrically connected to the anode power wire connection terminal PVDD, and the other terminal of the source and the drain of the driving transistor Td is electrically connected to the anode connection terminal N. Two poles of the storage capacitor C are electrically connected to the anode power wire connection terminal PVDD and a gate of the driving transistor Td, respectively. One terminal of a source and a drain of the switching transistor T is electrically connected to the gate of the driving transistor Td, and the other terminal of the source and the drain of the switching transistor T is electrically connected to a data wire Vdata. A gate of the switching transistor T is electrically connected to a scanning wire S. Each of the first sub-pixel columns 61 corresponds to one data wire Vdata, and each row of the pixel driving circuits 3 corresponds to one scanning wire S. During a driving process of the organic light emitting display panel, a plurality of the scanning wires S sequentially provide a turn-on level, and the turn-on level is a control level for turning on the switching transistor T, to cause the pixel driving circuit 3 to enter a data writing state row by row. In a data writing state, the turn-on level on the row of the scanning wires S controls the switching transistor T to be turned on, and a data signal on the data wire Vdata is written in the gate of the driving transistor Td. The driving transistor Td generates a driving current under control of a gate voltage, and the driving current controls the light emitting device 7 to emit light, to realize a display of a color of the corresponding sub-pixel, thereby completing scanning of one row of the sub-pixels. Thereafter, this row of the scanning wires S is at a turn-off level, i.e., a control level for turning off the switching transistor T, at which the switching transistors T in this row of the pixel driving circuits 3 are all turned off. At this time, due to the action of the storage capacitor C, a gate voltage of the driving transistor Td is stored. At this time, a next row of the scanning wires S is at the turn-on level, i.e., the next row performs scanning accordingly. By analogy, after scanning of all the sub-pixels is completed, refresh of an image is achieved.

The relationship between the anode power wire 5 and the pixel driving circuit 3 will be further described below. For the same light emitting device 7, it is driven by two pixel driving circuits 3, in which one of the pixel driving circuits 3 obtains an anode power supply voltage by connecting to the first extension segment 51 and the other pixel driving circuit 3 obtains an anode power supply voltage by connecting to the second extension segment 52. "X" in FIG. 1 is used to indicate a position where the pixel driving circuit 3 and the anode power wire 5 are connected. The first extension segment 51 and the second extension segment 52 are electrically connected to each other by a bent connection wire structure at a side facing away from the driving power supply 4, so that the anode power wire 5 has a U-shaped structure as a whole, in which the first extension segment 51 and the second extension segment 52 are respectively two arms of the U-shaped structure. For the anode power wire 5, a signal source is obtained by driving the power source 4. The signal is first transmitted through the first extension segment 51 in a direction facing away from the driving power supply 4, and is then, at the tail end of the first extension segment 51, transmitted through the second extension segment 52 in a direction close to the driving power supply 4, and is finally transmitted to the tail end of the second extension segment 52, i.e., an end of the second extension segment 52 closest to the driving power supply 4. The anode voltage signal will generate a voltage drop during the transmission by the anode power wire 5, i.e., at the anode power wire 5, starting from the driving power supply 4, a transmission path of the signal is negatively correlated with the voltage value on the anode power wire 5, i.e., the longer the transmission path of the signal, the lower the voltage at that position on the anode power wire 5. In the embodiment of the present disclosure, transmission directions of the anode power supply voltage on the first extension segment 51 and the second extension segment 52 are opposite to each other. In the same first sub-pixel column 61, for two different sub-pixels 60, although the anode power supply voltage obtained from the first extension segment 51 has a voltage drop, the anode power supply voltage obtained from the second extension segment 52 just has a voltage drop in an opposite direction, i.e., the anode power supply voltage drop on the second extension segment 52 can compensate for the anode power supply voltage drop on the first extension segment 51, such that in the case where write voltages of the data wires Vdata are the same, the light emitting brightness of two different sub-pixels 60 are closer in the same first sub-pixel column 61. For example, in FIG. 3, A1 and A2 are respectively two pixel driving circuits 3 corresponding to the same sub-pixel, and jointly drive the same light emitting device. A3 and A4 are respectively two pixel driving circuits 3 corresponding to another sub-pixel, and jointly drive the same light emitting device. An anode power supply voltage of 5.5V is obtained by A3 from the first extension segment 51, thereby driving the driving transistor Td in A3 to obtain a corresponding driving current I3. An anode power supply voltage of 5.4V is obtained by A1 from the first extension segment 51, thereby driving the driving transistor Td in A1 to obtain a corresponding driving current I1. An anode power supply voltage of 5.3V is obtained by A2 from the second extension segment 52, thereby driving the driving transistor Td in A2 to obtain a corresponding driving current I2. An anode power supply voltage of 5.2V is obtained by A4 from the second extension segment 52, thereby driving the driving transistor Td in A4 to obtain a corresponding driving current I4. A driving current of the light emitting device corresponding to A1 and A2 equals I1+I2, and a driving current of the light emitting device corresponding to A3 and A4 equals I3+I4, while the driving current is related to its corresponding anode power supply voltage, so that when the voltages on the data wires Vdata are the same, I1+I2=I3+I4, i.e., the light emitting brightness of the two light emitting devices are the same.

In the organic light emitting display panel of the embodiment of the present disclosure, the same light emitting device is configured to be driven by two pixel driving circuits, and the two pixel driving circuits respectively obtain the anode power supply voltage from the first extension segment and the second extension segment. Transmission directions of the anode power supply voltage on the first extension segment and the second extension segment are opposite to each other, such that in the driving process of the light emitting device, the anode power supply voltage at the corresponding position on the first extension segment and the second extension segment is compensated. Thus, for different sub-pixels in the first sub-pixel column, brightness of the light emitting device are closer, i.e., the problem of uneven display brightness caused by the voltage drop of the anode power supply voltage on the signal wire is alleviated.

Optionally, in each of the sub-pixels 60, equivalent circuit structures of the two pixel driving circuits 3 are the same. When the two pixel driving circuits 3 in the same sub-pixel 60 are the same, a compensation effect on the anode power supply voltage is better.

Optionally, in each of the sub-pixels 60, the two pixel driving circuits 3 are of mirror-image structures. For two identical pixel driving circuits 3, when the two are mirror-image structures, a layout is relatively simple, and the anode power wire 5 of a "U" structure can be better utilized to improve a space utilization rate.

Optionally, in each of the sub-pixels 60, the two pixel driving circuits 3 are electrically connected to the same data wire Vdata. Since the two pixel driving circuits 3 in each sub-pixel 60 have the same structure and are of mirror-image structures, the two pixel driving circuits 3 can be driven by the same data voltage. At this time, by arranging the two pixel driving circuits 3 to be electrically connected to the same data wire Vdata, number of the signal wires in the layout can be further reduced, thereby improving the space utilization rate.

Figure 4:
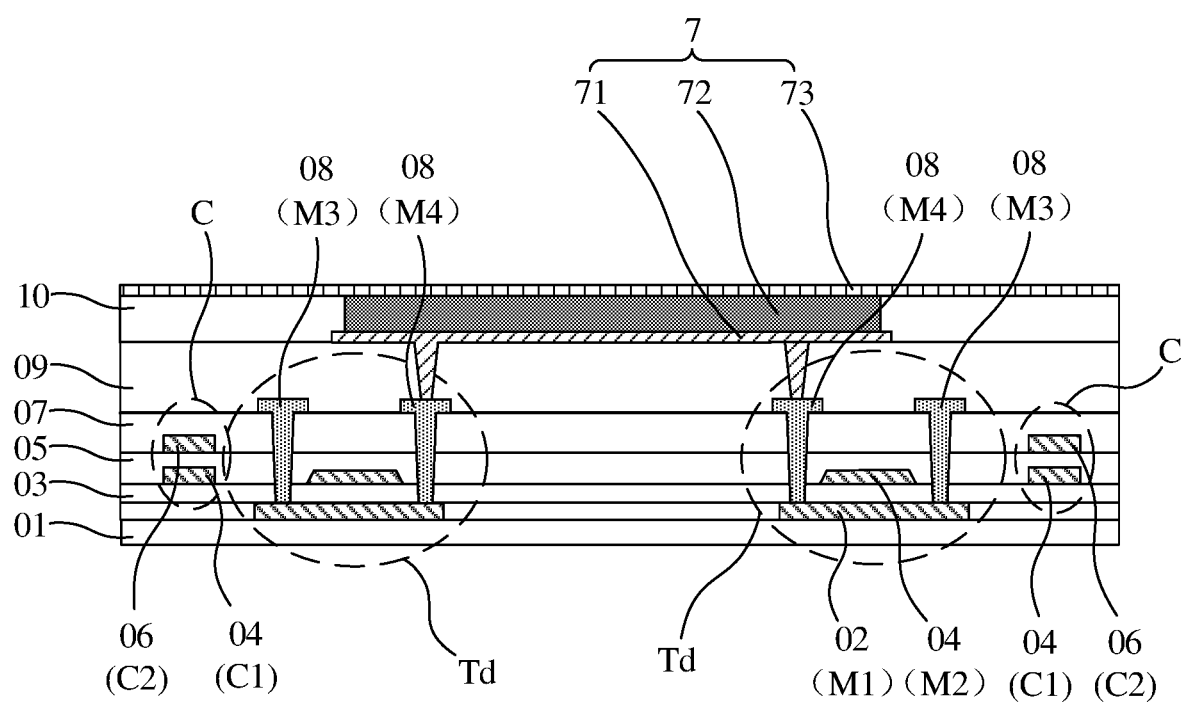
FIG. 4 is another cross-sectional structural schematic diagram of a sub-pixel in FIG. 1.

Optionally, as shown in FIG. 1, FIG. 3 and FIG. 4, FIG. 4 is another cross-sectional structural schematic diagram of one sub-pixel in FIG. 1. In each of the sub-pixels 60, the anode 71 of the light emitting device 7 has an uninterrupted continuous structure.

In the same sub-pixel 60, the two anode connection terminals N of the two pixel driving circuits 3 are electrically connected to the same node. At this time, a driving current value of the light emitting device 7 is equal to a sum of driving current values generated by the driving transistors Td of the two pixel driving circuits 3. Through a compensation action of the voltage drop of the anode power supply voltage on the first extension segment and the second extension segment, in the case where the data voltage provided by the data wire Vdata is constant, for the same column of the sub-pixels 60, different light emitting devices 7 correspond to the same driving currents, i.e., the light emitting brightness of the different light emitting devices 7 are the same.

Optionally, as shown in FIG. 1, FIG. 2 and FIG. 3, in each sub-pixel 60, the anode 71 of the light emitting device 7 includes a first anode 711 and a second anode 712. The first anode 711 and the second anode 712 are spaced apart from each other, and the anode connection terminals N of the two pixel driving circuits 3 are electrically connected to the first anode 711 and the second anode 712, respectively.

Although the anode 71 of the light emitting device 7 is respectively the first anode 711 and the second anode 712 that are independent from each other, since both the first anode 711 and the second anode 712 constitute the same light emitting device 7 together with the cathode 73, it can still be understood that the driving current value corresponding to the light emitting device 7 is equal to the sum of the driving current values generated by the driving transistors Td of the two pixel driving circuits 3. Through the compensation action of the voltage drop of the anode power supply voltage on the first extension segment and the second extension segment, in the case where the data voltage supplied from the data wire Vdata is constant, for the same column of the sub-pixels 60, different light emitting devices 7 correspond to the same driving current, i.e., the light emitting brightness of the different light emitting devices 7 are the same. It can also be understood that the light emitting device 7 is divided into two independent light emitting sub-devices, corresponding to the first anode 711 and the second anode 712, respectively. The brightness of one of the light emitting sub-devices is determined by a value of the driving current generated by the drive transistor Td of one of the pixel driving circuits 3, and the brightness of the other light emitting sub-device is determined by a value of the driving current generated by the driving transistor Td of the driving transistor 3 of the other one of the pixel driving circuit 3. However, overall light emitting brightness of the two light emitting sub-devices are related to the driving currents of the two pixel driving circuits 3. Therefore, through the compensation action of the voltage drop of the anode power supply voltage on the first extension segment and the second extension segment, in the case where the data voltage supplied from the data wire Vdata is constant, the different light emitting devices 7 have closer brightness for the same column of the sub-pixels 60.

Optionally, as shown in FIG. 1, the above organic light emitting display panel includes a plurality of anode power wires 5 arranged in a row direction x. Each of the anode power wires 5 corresponds to one first sub-pixel column 61, and the row direction x is perpendicular to the column direction y.

Figure 5:
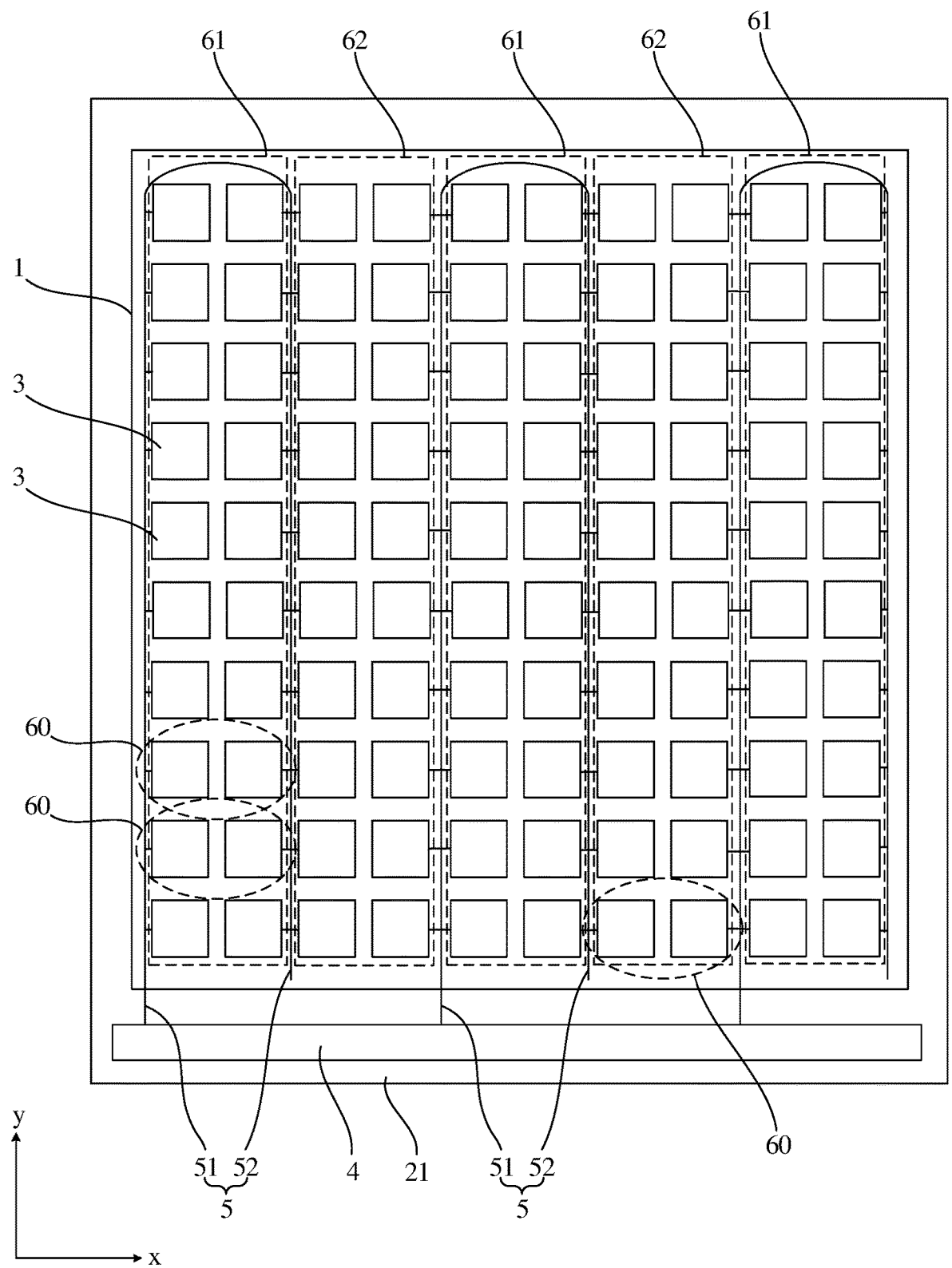
FIG. 5 is a structural schematic diagram of another organic light emitting display panel according to an embodiment of the present disclosure.
Figure 6:
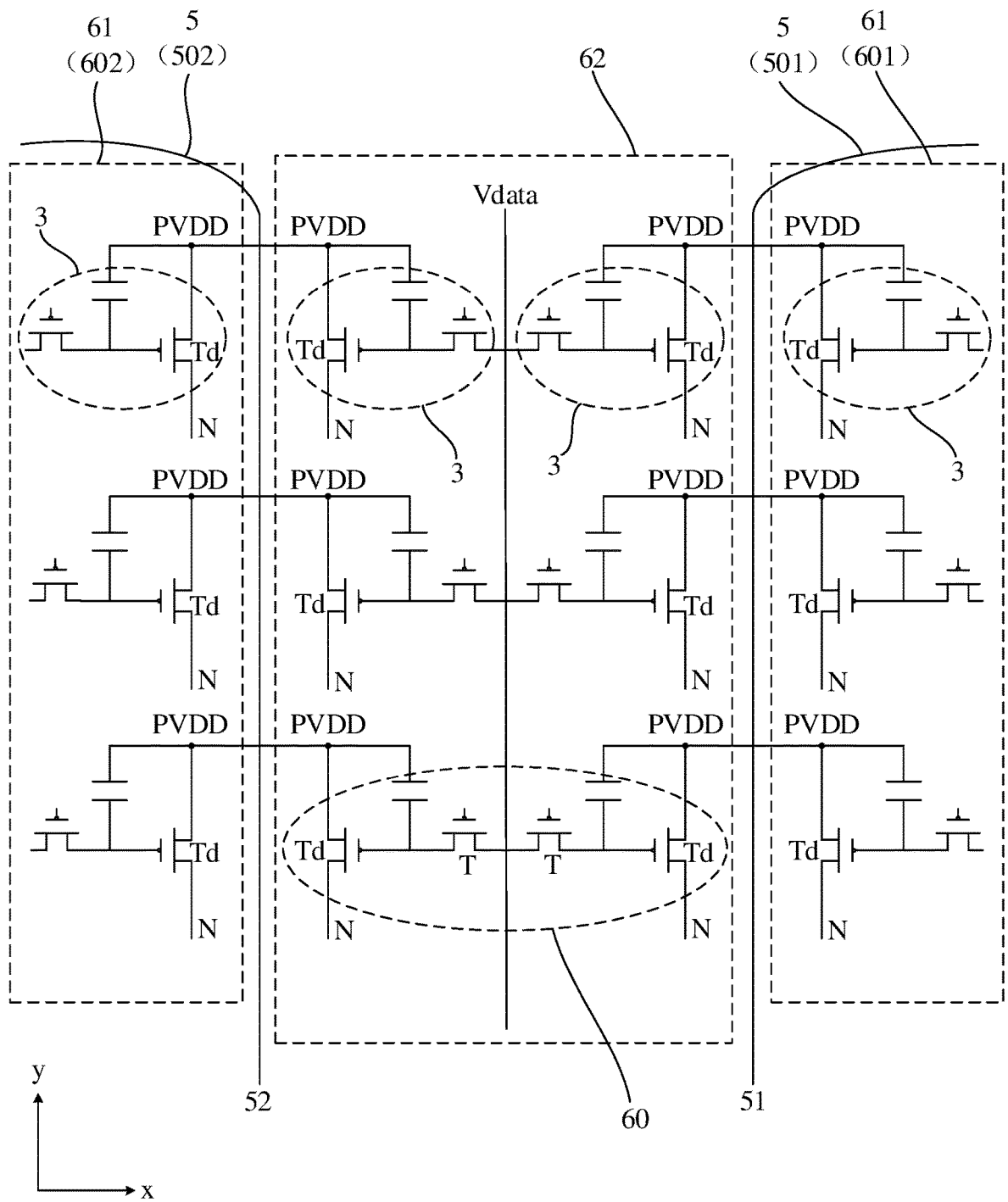
FIG. 6 is a partially enlarged schematic diagram of a partial region in FIG. 5.

Optionally, as shown in FIG. 5 and FIG. 6, FIG. 5 is a structural schematic diagram of another organic light emitting display panel according to an embodiment of the present disclosure, and FIG. 6 is a partially enlarged schematic diagram of a partial region in FIG. 5. The above organic light emitting display panel further includes a plurality of second sub-pixel columns 62 arranged in the row direction x, and one second sub-pixel column 62 is disposed between every two adjacent first sub-pixel columns 61. The second sub-pixel column 62 includes a plurality of sub-pixels 60 arranged in the column direction y. Each of the sub-pixels 60 includes a light emitting device (not shown in FIG. 5 and FIG. 6) and two pixel driving circuits 3. Each of the light emitting devices includes a cathode, an organic light emitting layer and an anode which are disposed in a stack manner. A film structure of the light emitting device in the second sub-pixel column 62 is the same as a film structure of the light emitting device in the first sub-pixel column 61. Referring to the structure of the light emitting device in FIG. 2 or FIG. 4, each pixel driving circuit 3 includes an anode power wire connection terminal PVDD, an anode connection terminal N, and a driving transistor Td connected in series between the anode power wire connection terminal PVDD and the anode connection terminal N. In the sub-pixel 60, both the anode connection terminals N of the two pixel driving circuits 3 are electrically connected to the anode of the light emitting device. For each second sub-pixel column 62, the two first sub-pixel columns 61 adjacent to the second sub-pixel column 62 in the row direction x are a first adjacent sub-pixel column 601 and a second adjacent sub-pixel column 602, respectively. An anode power wire 5 corresponding to the first adjacent sub-pixel column 601 is a first adjacent anode power wire 501, and an anode power wire 5 corresponding to the second adjacent sub-pixel column 602 is a second adjacent anode power wire 502. In each of the sub-pixels 60 of each of the second sub-pixel columns 62, the anode power wire connection terminals PVDD of the two pixel driving circuits 3 are electrically connected to the first extension segment 51 of the first adjacent anode power wire 501 and the second extension segment 52 of the second adjacent anode power wire 502, respectively.

In some embodiments, a specific structure of the second sub-pixel column 62 may be similar to a specific structure of the first sub-pixel column 61 in the above embodiments, one difference being that each of the first sub-pixel columns 61 is individually provided with a corresponding anode power wire 5, while the second sub-pixel column 62 is not provided with an individual anode power wire 5, and the pixel driving circuit 3 in the second sub-pixel column 62 shares the anode power wire 5 with the adjacent first sub-pixel column 61, for example, as the structure shown in FIG. 6. In some embodiments, the foregoing difference is the only difference between the specific structure of the second sub-pixel column 62 and the specific structure of the first sub-pixel column 61. In one sub-pixel 60 in the second sub-pixel column 62, an anode power wire connection terminal PVDD of one pixel driving circuit 3 is electrically connected to the second extension segment 52 corresponding to the first sub-pixel column 61 adjacent to the left side, and an anode power wire connection terminal PVDD of the other pixel driving circuit 3 is electrically connected to the first extension segment 51 corresponding to the first sub-pixel column 61 adjacent to the right side. Two pixel driving circuits 3 in the same sub-pixel 60 are respectively connected to two anode power wires 5, and correspondingly connected to the first extension segment 51 and the second extension segment 52 therein. The first extension segment 51 and the second extension segment 52 belong to different anode power wires 5, respectively, however, they both transmit the same anode power supply voltage signal, and the anode power supply voltage signals are transmitted in opposite directions. Therefore, the anode power supply voltages obtained by the second sub-pixel column 62 from the first extension segment 51 and the second extension segment 52 have voltage drops in opposite directions. The anode power supply voltage drop on the second extension segment 52 can also compensate for the anode power supply voltage drop on the first extension segment 51. The specific compensation principle is the same as that in the case where the anode power supply voltages are obtained from the same anode power wire 5 in the first sub-pixel column 61, which will not be described again. Therefore, compared with the structure shown in FIG. 1, both the structures shown in FIG. 5 and FIG. 6 can make the light emitting brightness of different sub-pixels in the same column of sub-pixels closer to each other, i.e., the problem of uneven display brightness due to the voltage drop of the anode power supply voltage on the signal wire is alleviated. Moreover, due to the multiplexing of the anode power wire 5, the number of anode power wires 5 is reduced, thereby increasing the space utilization rate of the display panel.

Optionally, as shown in FIG. 1 and FIG. 5, in the display region 1, the plurality of anode power wires 5 are insulated from each other, so as to ensure that different anode power wires 5 do not have the same potentials between the display regions 1 and cause the same anode power wire 5 to have a corresponding change in the voltage drop in the display regions 1, thereby utilizing the change in the voltage drop more effectively to compensate for the anode power supply voltage by the action of the first extension segment 51 and the second extension segment 52.

Optionally, as shown in FIG. 1 and FIG. 5, the tail end of the second extension segment 52 of each anode power wire 5 is suspended, which reduces the space occupied by the signal wires while ensuring that the anode power supply voltage signal has voltage drops in opposite directions on the second extension segment 52 and the first extension segment 51.

Figure 7:
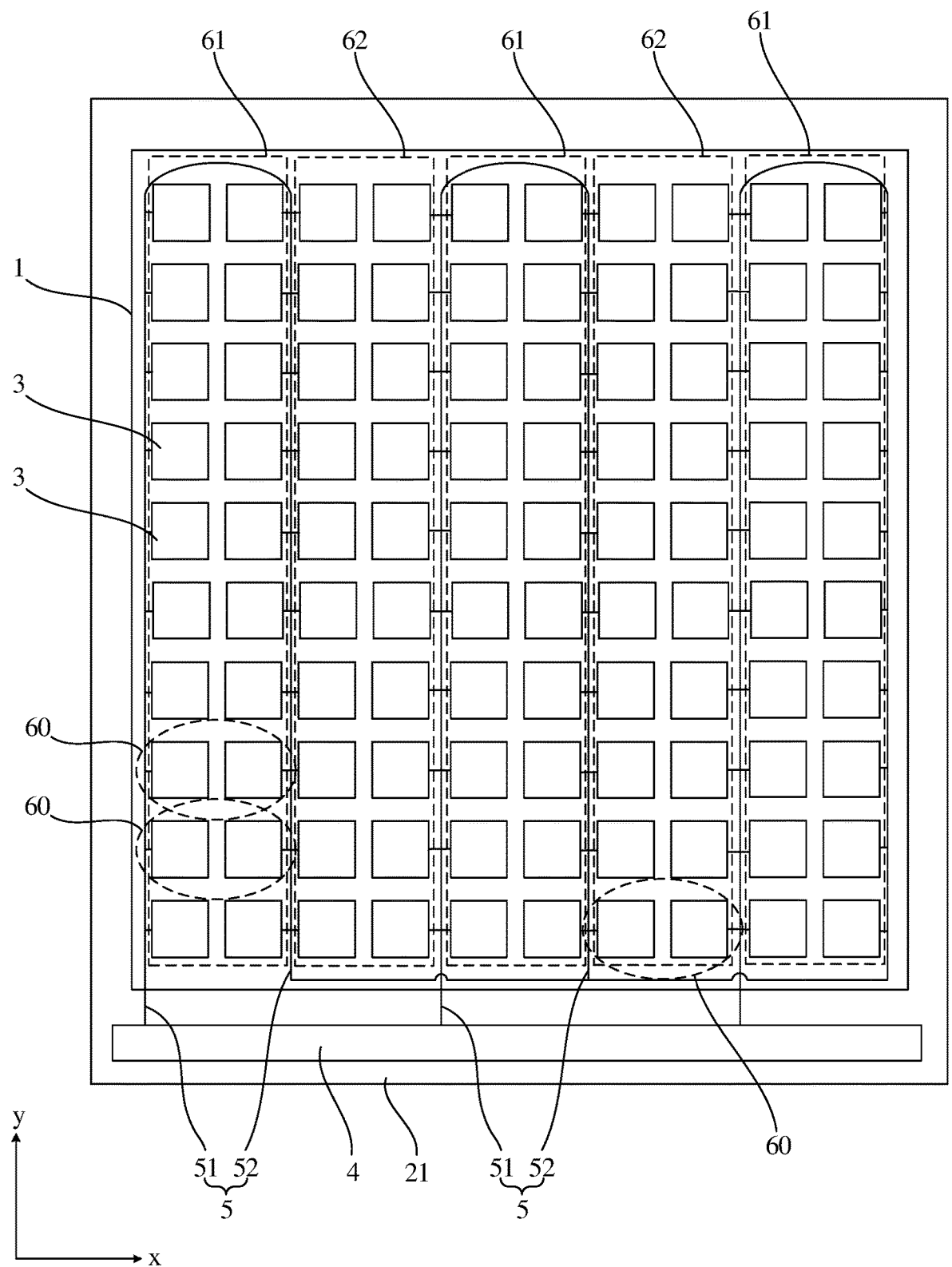
FIG. 7 is a structural schematic diagram of an organic light emitting display panel according to an embodiment of the present disclosure.

Optionally, as shown in FIG. 7, the tail ends of the second extension segments 52 of the plurality of anode power wires 5 are electrically connected to each other. The tail ends of the second extension segments 52 of different anode power wires 5 are electrically connected to each other. However, it is necessary to ensure insulation between the tail end of the second extension segment 52 and the driving power supply 4, so as to ensure that the anode power supply voltage is compensated by the first extension segment 51 and the second extension segment 52. Electrically connecting the tail ends of the second extension segments 52 of the plurality of anode power wires 5 to each other can make the voltage between the second extension segments 52 of the different anode power wires 5 consistent, further alleviating the problem of uneven brightness of the different sub-pixels 60 in the row direction x.

Figure 8:
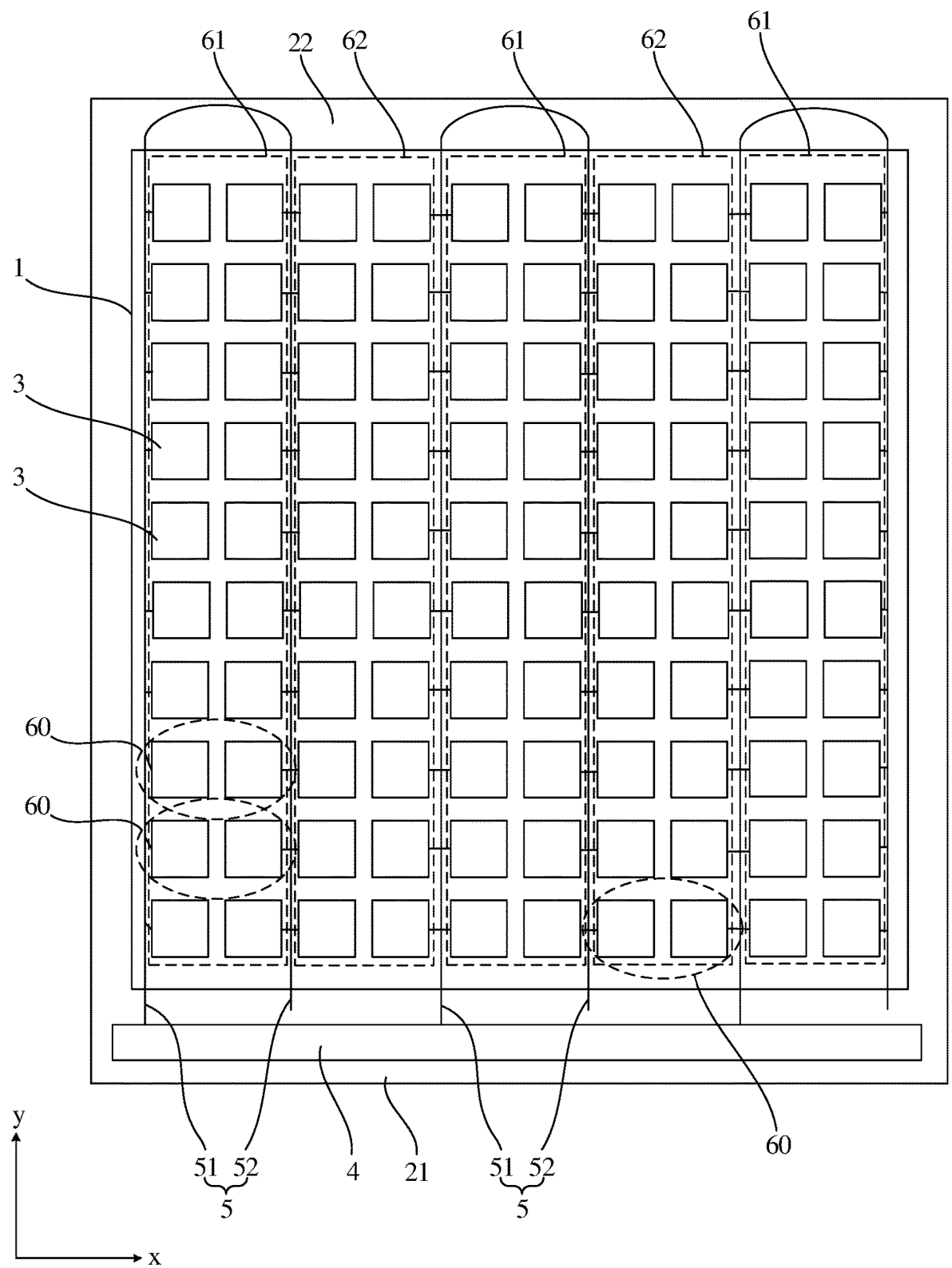
FIG. 8 is a structural schematic diagram of an organic light emitting display panel according to an embodiment of the present disclosure.

Optionally, as shown in FIG. 8, FIG. 8 is a structural schematic diagram of an organic light emitting display panel according to an embodiment of the present disclosure. The organic light emitting display panel further includes a second non-display region 22 at a side of the display region 1 facing away from the first non-display region 21 in the column direction y. The first extension segment 51 passes through the display region 1 in the column direction y and extends to the second non-display region 22, and the tail end of the first extension segment 51 is electrically connected to the head end of the second extension segment 52 in the second non-display region 22. By arranging the tail end of the first extension segment 51 to be connected with the head end of the second extension segment 52 in the second non-display region 22 through a bent signal wire, the space utilization rate of the display region 1 can be improved.

Optionally, as shown in FIG. 8, the second extension segment 52 extends in the column direction y to the first non-display region 21.

Figure 9:
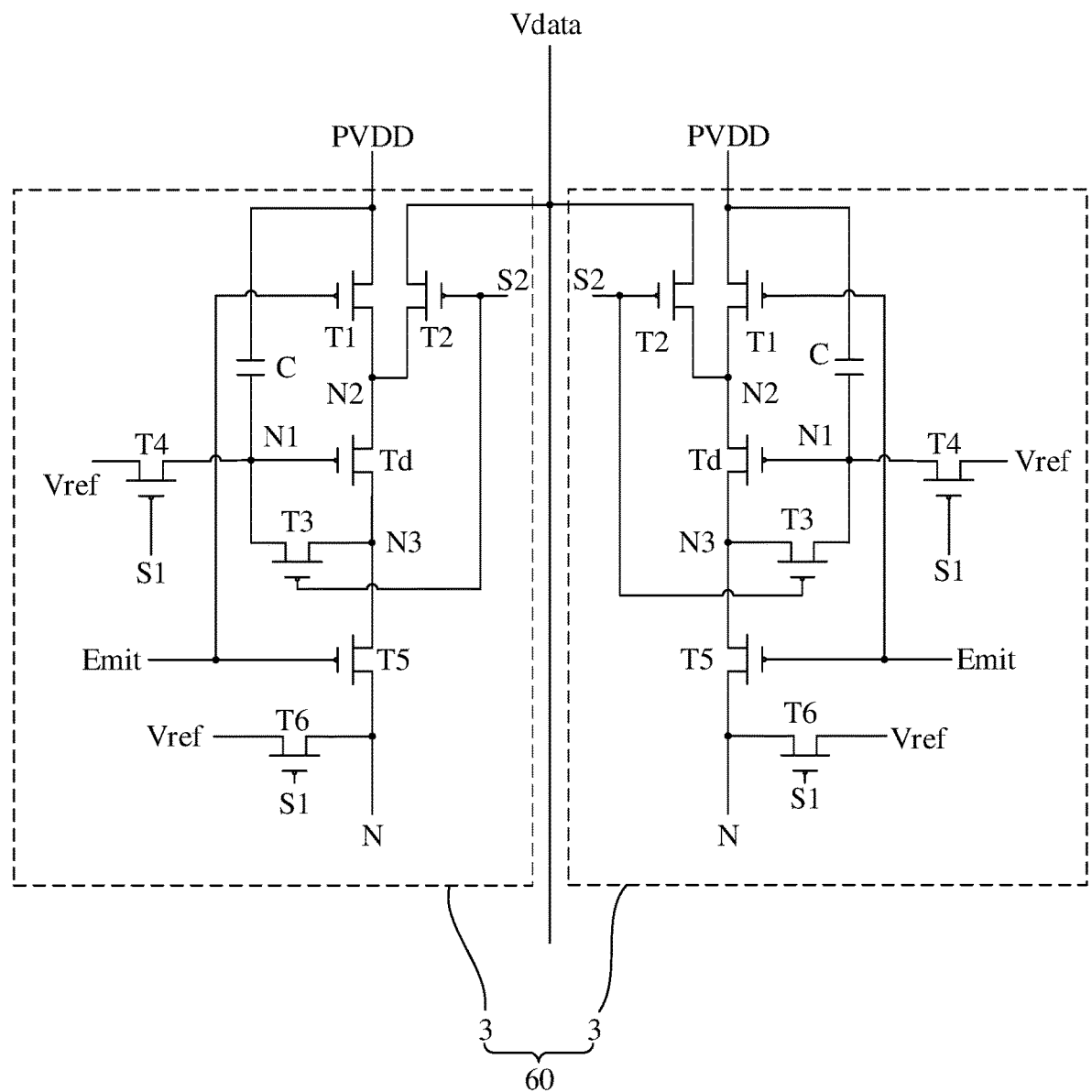
FIG. 9 is a structural schematic diagram of another pixel driving circuit according to an embodiment of the present disclosure.
Figure 10:
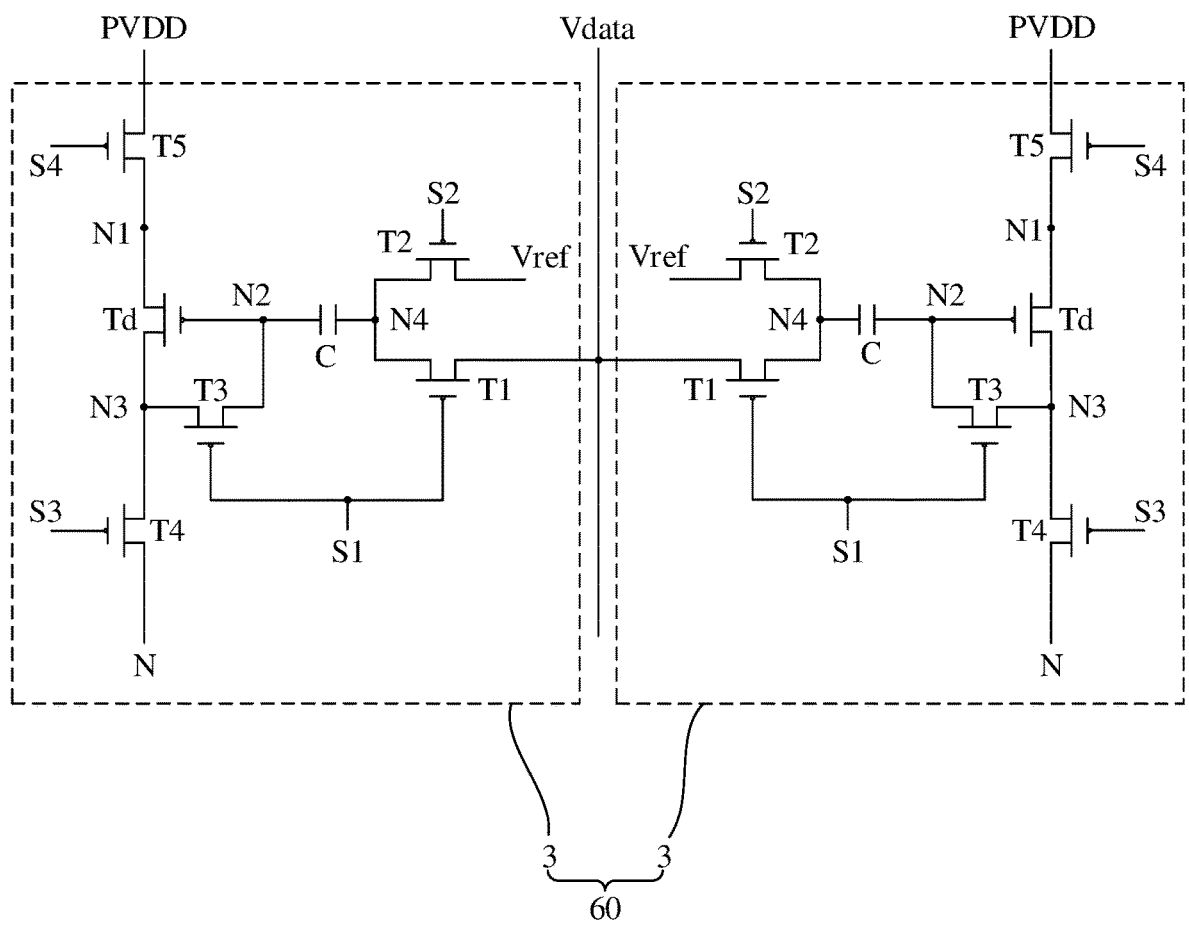
FIG. 10 is a structural schematic diagram of another pixel driving circuit according to an embodiment of the present disclosure.

In addition, the pixel driving circuit 3 of the 2T1C structure is illustrated in FIG. 3 and FIG. 6. The specific structure of the pixel driving circuit is not limited in the embodiment of the present disclosure, and the pixel driving circuit may also be of other structures. For example, as shown in FIG. 9, FIG. 9 is a structural schematic diagram of another pixel driving circuit according to an embodiment of the present disclosure. The pixel driving circuit 3 shown in FIG. 9 is a 7T1C structure, i.e., including seven thin film transistors and one capacitor, wherein there is one driving transistor Td and six switching transistors. A gate of the driving transistor Td is electrically connected to the first node N1, and one terminal of the source and the drain thereof is electrically connected to a second node N2, and the other terminal thereof is electrically connected to a third node N3; a gate of the first switching transistor T1 is electrically connected to a light emitting control terminal Emit, and one terminal of the source and the drain is electrically connected to the anode power wire connection terminal PVDD, and the other terminal thereof is electrically connected to the second node N2; a gate of the second switching transistor T2 is electrically connected to a second scanning terminal S2, and one terminal of the source and the drain is electrically connected to the data wire Vdata and the other terminal thereof is electrically connected to the second node N2; a gate of the third switching transistor T3 is electrically connected to the second scanning terminal S2, and one terminal of the source and the drain is electrically connected to the first node N1, and the other terminal thereof is electrically connected to the third node N3; a gate of the fourth switching transistor T4 is electrically connected to a first scanning terminal S1, and one terminal of the source and the drain is electrically connected to a reference voltage terminal Vref and the other terminal thereof is electrically connected to the first node N1; a gate of the fifth switching transistor T5 is electrically connected to the light emitting control terminal Emit, and one terminal of the source and the drain is electrically connected to the third node N3 and the other terminal thereof is electrically connected to the anode connection terminal N; a gate of the sixth switching transistor T6 is electrically connected to the first scanning terminal S1, and one terminal of the source and the drain is electrically connected to the reference voltage terminal Vref and the other terminal thereof is electrically connected to the anode connection terminal N; the two poles of the storage capacitor C are electrically connected to the anode power wire connection terminal PVDD and the first node N1, respectively. As shown in FIG. 10, FIG. 10 is a structural schematic diagram of another pixel driving circuit according to an embodiment of the present disclosure. The pixel driving circuit 3 shown in FIG. 10 is a 6T1C structure, i.e., includes six thin film transistors and one capacitor, of which one is driving transistor Td and the other five are switching transistors. The gate of the driving transistor Td is electrically connected to the second node N2, and one terminal of the source and the drain is electrically connected to the first node N1, and the other terminal thereof is electrically connected to the third node N3; the gate of the first switching transistor T1 is electrically connected to the first scanning terminal S1, and one terminal of the source and the drain is electrically connected to the data wire Vdata, and the other terminal thereof is electrically connected to a fourth node N4; the gate of the second switching transistor T2 is electrically connected to the second scanning terminal S2, and one terminal of the source and the drain is electrically connected to the reference voltage terminal Vref, and the other terminal thereof is electrically connected to the fourth node N4; the gate of the third switching transistor T3 is electrically connected to the first scanning terminal S1, and one terminal of the source and the drain is electrically connected to the second node N2, and the other terminal thereof is electrically connected to the third node N3; the gate of the fourth switching transistor T4 is electrically connected to a third scanning terminal S3, and one terminal of the source and the drain is electrically connected to the third node N3, and the other terminal thereof is electrically connected to the anode connection terminal N; the gate of the fifth switching transistor T5 is electrically connected to a fourth scanning terminal S4, and one terminal of the source and the drain is electrically connected to the anode power wire connection terminal PVDD, and the other terminal thereof is electrically connected to the first node N1; the two poles of the storage capacitor C are electrically connected to the second node N2 and the fourth node N4, respectively. It can be seen that the driving transistor Td is connected in series between the anode power wire connection terminal PVDD and the anode connection terminal N, regardless of the type of the pixel driving circuit.

Figure 11:
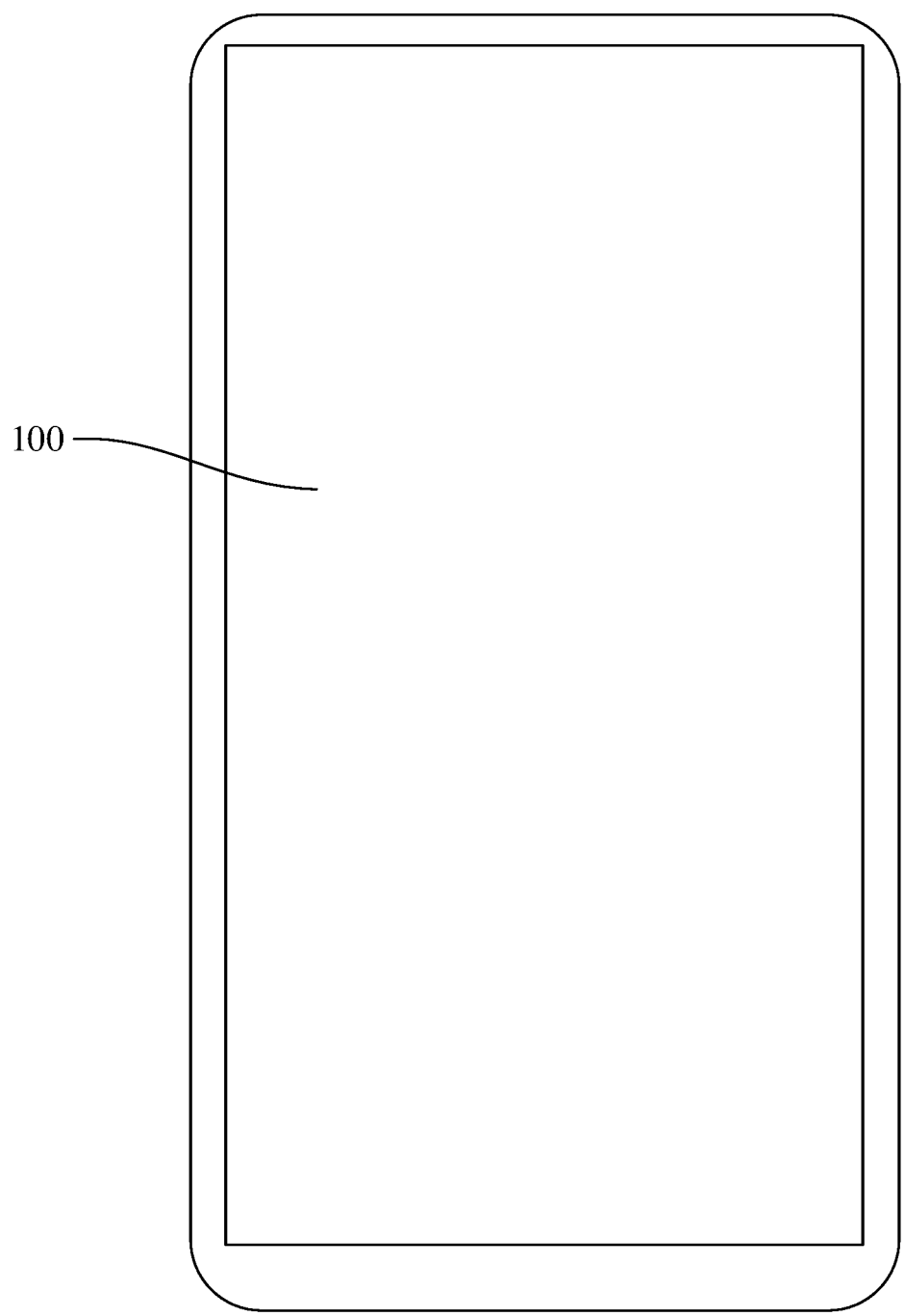
FIG. 11 is a structural schematic diagram of a display device according to an embodiment of the present disclosure.

As shown in FIG. 11, FIG. 11 is a structural schematic diagram of a display device according to an embodiment of the present disclosure. The embodiment of the present disclosure further provides a display device including the organic light emitting display panel 100 above.

The specific structure of the display panel 100 is the same as that in the foregoing embodiments, and details are not described herein again. The display device may be any electronic device having a display function such as a mobile phone, a tablet computer, a laptop computer, an electronic paper book, or a television.

In the display device of the embodiment of the present disclosure, the same light emitting device is configured to be driven by two pixel driving circuits, and the two pixel driving circuits respectively obtain the anode power supply voltage from the first extension segment and the second extension segment. Transmission directions of the anode power supply voltage on the first extension segment and the second extension segment are opposite to each other, such that in the driving process of the light emitting device, the anode power supply voltage at the corresponding position on the first extension segment and at the second extension segment is mutually compensated. Thus, for different sub-pixels in the first sub-pixel column, brightness of the light emitting device are closer, i.e., the problem of uneven display brightness caused by the voltage drop of the anode power supply voltage on the signal wire is alleviated.

The above are only the preferred embodiments of the present disclosure and are not intended to limit the present disclosure. Any modifications, equivalents, improvements, etc., which are made within the spirit and principles of the present disclosure, should be included in the scope of the present disclosure.

The above-described embodiments are representative of the present disclosure; but the invention is not limited to such embodiments. Although the present disclosure has been described in detail with reference to the above-described embodiments, it should be understood by those skilled in the art that, it is still possible to modify the technical solutions described in the above embodiments or to equivalently replace some or all of the technical features therein, but these modifications or replacements do not cause the essence of corresponding technical solutions to depart from the scope of the present disclosure.

What is claimed is:

1. An organic light emitting display panel having a display region and a first non-display region located at a side of the display region in a column direction, the organic light emitting display panel comprising:
   a plurality of pixel driving circuits arranged in a matrix and located in the display region;
   a driving power supply located in the first non-display region;
   one or more anode power wires each comprising a first extension segment and a second extension segment, a head end of the first extension segment being electrically connected to the driving power supply, the first extension segment extending at least to a first position along the column direction, a tail end of the first extension segment being electrically connected to a head end of the second extension segment, the second extension segment extending at least to a second position along the column direction, wherein a row of pixel driving circuits of the plurality of pixel driving circuits in the display region that is farthest from the first non-display region is located at the first position, and a row of pixel driving circuits of the plurality of pixel driving circuits in the display region that is closest to the first non-display region is located at the second position; and
   one or more first sub-pixel columns corresponding to the one or more anode power wires, each of the one or more first sub-pixel columns comprising a plurality of sub-pixels arranged in the column direction, each of the plurality of sub-pixels comprising one light emitting device and two pixel driving circuits of the plurality of pixel driving circuits, wherein the two pixel driving circuits of each sub-pixel are configured to drive the same one light emitting device of the sub-pixel, the light emitting device comprising a cathode, an organic light emitting layer and an anode that are disposed in a stacked manner, each of the two pixel driving circuits comprising an anode power wire connection terminal, an anode connection terminal, and a driving transistor connected in series between the anode power wire connection terminal and the anode connection terminal, wherein in the sub-pixel, the anode connection terminals of the two pixel driving circuits are electrically connected to the anode of the light emitting device;

wherein in each of the plurality of sub-pixels of each first sub-pixel column of the one or more first sub-pixel columns, the anode power wire connection terminals of the two pixel driving circuits are respectively electrically connected to the first extension segment and the second extension segment of one of the one or more anode power wires corresponding to the first sub-pixel column, wherein the one or more anode power wires comprise a plurality of anode power wires arranged in a row direction, each anode power wire of the plurality of anode power wires corresponding to one of the one or more first sub-pixel columns, wherein the row direction is perpendicular to the column direction, and wherein the display panel further comprises:

a plurality of second sub-pixel columns arranged in the row direction, and one second sub-pixel column of the plurality of second sub-pixel columns being disposed between every two adjacent first sub-pixel columns of the one or more first sub-pixel columns;

wherein each sub-pixel column of the plurality of second sub-pixel columns comprises a plurality of sub-pixels arranged in the column direction, wherein each sub-pixel of the plurality of sub-pixels comprises one light emitting device and two pixel driving circuits, wherein the two pixel driving circuits of each sub-pixel are configured to drive the same one light emitting device of the sub-pixel, wherein the light emitting device comprises a cathode, an organic light emitting layer and an anode that are disposed in a stack manner, wherein each of the two pixel driving circuits comprises an anode power wire connection terminal, an anode connection terminal, and a driving transistor connected in series between the anode power wire connection terminal and the anode connection terminal, and in the sub-pixel, the anode connection terminals of the two pixel driving circuits are electrically connected to the anode of the light emitting device;

wherein for each sub-pixel column of the plurality of second sub-pixel columns, two first sub-pixel columns adjacent to the second sub-pixel column in the row direction are respectively a first adjacent sub-pixel column and a second adjacent sub-pixel column, an anode power wire of the plurality of anode power wires corresponding to the first adjacent sub-pixel column is a first adjacent anode power wire, and an anode power wire of the plurality of anode power wires corresponding to the second adjacent sub-pixel column is a second adjacent anode power wire.

2. The organic light emitting display panel according to claim 1, wherein for each of the plurality of sub-pixels, equivalent circuit structures of the two pixel driving circuits are identical.

3. The organic light emitting display panel according to claim 2, wherein for each of the plurality of sub-pixels, the two pixel driving circuits are in a mirror structure.

4. The organic light emitting display panel according to claim 3, wherein for each of the plurality of sub-pixels, the two pixel driving circuits are electrically connected to a same data wire.

5. The organic light emitting display panel according to claim 1, wherein for each of the plurality of sub-pixels, the anode of the light emitting device has an uninterrupted continuous structure.

6. The organic light emitting display panel according to claim 1, wherein for each of the plurality of sub-pixels, the anode of the light emitting device comprises a first anode and a second anode, and the first anode and the second anode are spaced apart from each other, and the anode connection terminals of the two pixel driving circuits are electrically connected to the first anode and the second anode, respectively.

7. The organic light emitting display panel according to claim 1, wherein
in each sub-pixel of the plurality of sub-pixels of each second sub-pixel column of the plurality of second sub-pixel columns, the anode power wire connection terminals of the two pixel driving circuits are respectively electrically connected to the first extension segment of the first adjacent anode power wire and the second extension segment of the second adjacent anode power wire.

8. The organic light emitting display panel according to claim 1, wherein in the display region, the anode power wires of the plurality of the anode power wires are insulated from each other.

9. The organic light emitting display panel according to claim 1, wherein a tail end of the second extension segment of each of the plurality of anode power wires is suspended.

10. The organic light emitting display panel according to claim 1, wherein tail ends of the second extension segments of the plurality of anode power wires are electrically connected to each other.

11. The organic light emitting display panel according to claim 1, further comprising a second non-display region located at a side of the display region facing away from the first non-display region in the column direction,
wherein the first extension segment extends to the second non-display region through the display region in the column direction, and the tail end of the first extension segment is electrically connected to the head end of the second extension segment in the second non-display region.

12. The organic light emitting display panel according to claim 1, wherein the second extension segment extends in the column direction to the first non-display region.

13. A display device, comprising an organic light emitting display panel, wherein the organic light emitting display panel has a display region and a first non-display region located at a side of the display region in a column direction, and the organic light emitting display panel comprises:
a plurality of pixel driving circuits arranged in a matrix and located in the display region;
a driving power supply located in the first non-display region;
one or more anode power wires each comprising a first extension segment and a second extension segment, a head end of the first extension segment being electrically connected to the driving power supply, the first extension segment extending at least to a first position along the column direction, a tail end of the first extension segment being electrically connected to a head end of the second extension segment, the second extension segment extending at least to a second position along the column direction, wherein a row of pixel driving circuits of the plurality of pixel driving circuits in the display region that is farthest from the first non-display region is located at the first position, and a row of pixel driving circuits of the plurality of pixel driving circuits in the display region that is closest to the first non-display region is located at the second position; and one or more first sub-pixel columns corresponding to the one or more anode power wires, each of the one or more first sub-pixel columns comprising a plurality of sub-pixels arranged in the column direction, each of the plurality of sub-pixels comprising one light emitting device and two pixel driving circuits of the plurality of pixel driving circuits, wherein the two pixel driving circuits of each sub-pixel are configured to drive the same one light emitting device of the sub-pixel, the light emitting device comprising a cathode, an organic light emitting layer and an anode that are disposed in a stacked manner, each of the two pixel driving circuits comprising an anode power wire connection terminal, an anode connection terminal, and a driving transistor connected in series between the anode power wire connection terminal and the anode connection terminal, wherein in the sub-pixel, the anode connection terminals of the two pixel driving circuits are electrically connected to the anode of the light emitting device;

wherein in each of the plurality of sub-pixels of each first sub-pixel column of the one or more first sub-pixel columns, the anode power wire connection terminals of the two pixel driving circuits are respectively electrically connected to the first extension segment and the second extension segment of one of the one or more anode power wires corresponding to the first sub-pixel column, wherein the one or more anode power wires comprise a plurality of anode power wires arranged in a row direction, each anode power wire of the plurality of anode power wires corresponding to one of the one or more first sub-pixel columns, and the row direction is perpendicular to the column direction, and wherein the display panel further comprises:

a plurality of second sub-pixel columns arranged in the row direction, and one second sub-pixel column of the plurality of second sub-pixel columns being disposed between every two adjacent first sub-pixel columns of the one or more first sub-pixel columns;

wherein each second sub-pixel column of the plurality of second sub-pixel columns comprises a plurality of sub-pixels arranged in the column direction, each sub-pixel of the plurality of sub-pixels comprises one light emitting device and two pixel driving circuits, wherein the two pixel driving circuits of each sub-pixel are configured to drive the same one light emitting device of the sub-pixel, wherein the light emitting device comprises a cathode, an organic light emitting layer and an anode that are disposed in a stack manner, wherein each pixel driving circuit of the two pixel driving circuits comprises an anode power wire connection terminal, an anode connection terminal, and a driving transistor connected in series between the anode power wire connection terminal and the anode connection terminal, and in the sub-pixel, the anode connection terminals of the two pixel driving circuits are electrically connected to the anode of the light emitting device;

wherein for each second sub-pixel column of the plurality of second sub-pixel columns, two first sub-pixel columns adjacent to the second sub-pixel column in the row direction are respectively a first adjacent sub-pixel column and a second adjacent sub-pixel column, an anode power wire of the plurality of anode power wires corresponding to the first adjacent sub-pixel column is a first adjacent anode power wire, and an anode power wire of the plurality of anode power wires corresponding to the second adjacent sub-pixel column is a second adjacent anode power wire.

14. An organic light emitting display panel having a display region and a first non-display region located at a side of the display region in a column direction, the organic light emitting display panel comprising:

a plurality of pixel driving circuits arranged in a matrix and located in the display region;

a driving power supply located in the first non-display region;

one or more anode power wires each comprising a first extension segment and a second extension segment, a head end of the first extension segment being electrically connected to the driving power supply, the first extension segment extending at least to a first position along the column direction, a tail end of the first extension segment being electrically connected to a head end of the second extension segment, the second extension segment extending at least to a second position along the column direction, wherein a row of pixel driving circuits of the plurality of pixel driving circuits in the display region that is farthest from the first non-display region is located at the first position, and a row of pixel driving circuits of the plurality of pixel driving circuits in the display region that is closest to the first non-display region is located at the second position; and one or more first sub-pixel columns corresponding to the one or more anode power wires, each first sub-pixel column of the one or more first sub-pixel columns comprising a plurality of sub-pixels arranged in the column direction, each sub-pixel of the plurality of sub-pixels comprising one light emitting device and two pixel driving circuits of the plurality of pixel driving circuits, wherein the two pixel driving circuits of each sub-pixel are configured to drive the same one light emitting device of the sub-pixel, the light emitting device comprising a cathode, an organic light emitting layer and an anode that are disposed in a stacked manner, each of the two pixel driving circuits comprising an anode power wire connection terminal, an anode connection terminal, and a driving transistor connected in series between the anode power wire connection terminal and the anode connection terminal, wherein in the sub-pixel, the anode connection terminals of the two pixel driving circuits are electrically connected to the anode of the light emitting device;

wherein in each sub-pixel of the plurality of sub-pixels of each first sub-pixel column of the one or more first sub-pixel columns, the anode power wire connection terminals of the two pixel driving circuits are respectively electrically connected to the first extension segment and the second extension segment of one of the one or more anode power wires corresponding to the first sub-pixel column, wherein the display panel further comprises a second non-display region located at a side of the display region facing away from the first non-display region in the column direction, wherein the first extension segment extends to the second non-display region through the display region in the column direction, and the tail end of the first extension segment is electrically connected to the head end of the second extension segment in the second non-display region.

15. The organic light emitting display panel according to claim 14, wherein for each sub-pixel of the plurality of sub-pixels, equivalent circuit structures of the two pixel driving circuits are identical.

16. The organic light emitting display panel according to claim 15, wherein for each sub-pixel of the plurality of sub-pixels, the two pixel driving circuits are in a mirror structure.

17. The organic light emitting display panel according to claim 16, wherein for each sub-pixel of the plurality of sub-pixels, the two pixel driving circuits are electrically connected to a same data wire.

18. The organic light emitting display panel according to claim 14, wherein for each sub-pixel of the plurality of sub-pixels, the anode of the light emitting device has an uninterrupted continuous structure.

19. The organic light emitting display panel according to claim 14, wherein for each sub-pixel of the plurality of sub-pixels, the anode of the light emitting device comprises a first anode and a second anode, and the first anode and the second anode are spaced apart from each other, and the anode connection terminals of the two pixel driving circuits are electrically connected to the first anode and the second anode, respectively.

* * * * *